United States Patent [19]

Okamura et al.

[11] Patent Number: 5,508,703
[45] Date of Patent: Apr. 16, 1996

[54] MEMBRANE SWITCH HAVING A ROTARY MOTION DETECTION FUNCTION

[75] Inventors: Ryo Okamura; Hidemasa Sakurada, both of Tokyo, Japan

[73] Assignee: SMK Corporation, Tokyo, Japan

[21] Appl. No.: 121,160

[22] Filed: Sep. 14, 1993

[30] Foreign Application Priority Data

Sep. 14, 1992 [JP] Japan ................... 4-270953

[51] Int. Cl.6 .................................. G08C 19/12
[52] U.S. Cl. ................ 341/176; 200/14; 341/20; 341/22; 341/23; 341/35; 341/190
[58] Field of Search ................... 341/20, 22, 23, 341/26, 30, 34, 35, 173, 176, 184, 185, 187, 188, 190; 200/241, 9, 14

[56] References Cited

U.S. PATENT DOCUMENTS

| | | | |
|---|---|---|---|
| 3,898,421 | 8/1975 | Suzumura | 200/241 |
| 4,221,975 | 9/1980 | Ledniczki et al. | 341/20 |
| 4,246,452 | 1/1981 | Chandler | 341/20 |
| 4,963,876 | 10/1990 | Sanders et al. | 341/176 |
| 5,119,078 | 6/1992 | Grant | 341/23 |

Primary Examiner—John K. Peng
Assistant Examiner—Andrew Hill
Attorney, Agent, or Firm—Christopher R. Pastel; Thomas R. Morrison

[57] ABSTRACT

A membrane switch having a rotary motion detection function comprises a flexible sheet, in which movable electrodes are formed that correspond to multiple keys, and a printed wiring board, in which fixed electrodes are formed that correspond to the movable electrodes. The flexible sheet and printed wiring board are arranged in layers so that the movable and fixed electrodes face each other with a prescribed spacing between them. When any key on the membrane switch is pressed and thus turned on, that key's signal is detected. When multiple keys are turned on in succession within a prescribed time interval, codes are sent that correspond to the direction and speed of movement of the sequence of turned-on keys. The rotary motion keys are arranged in a circle. The codes that correspond to the direction and speed of shift of the turned-on keys are preset in a microprocessor. The rotary motion keys can be arranged on the same board with other general keys to make up a remote control device.

10 Claims, 7 Drawing Sheets

PRIOR ART

MEMBRANE SWITCH HAVING A ROTARY MOTION DETECTION FUNCTION

BACKGROUND OF THE INVENTION

This invention relates to a sheet-type membrane switch that has a rotary motion detection function. Switches having a rotary motion function have come into wide use recently in remote controls for editing and program setting of VCRs, CD players, video disks, and DATs.

Until now, switches with a rotary motion function used for the applications mentioned above have had an inner shaft with a rotary motion function and an outer shaft with a shuttle function. The basic mechanism of a switch with a rotary motion function such as this is its rotary encoder. For example, in rotary motion mode, such a switch can send 16 codes from its four output terminals. Each output terminal sends a binary signal, and a specified control code can be sent from within a fixed time interval.

The problem with a switch of this type is that, because of its complex mechanical structure, it is difficult to manufacture in a small size and at a low cost. Thus the challenge, met by the present invention, is to create a thin, low-priced digital switch by using an electrical structure and software processing to replace, as much as possible, the complicated mechanical structure of conventional switches having a rotary motion function.

OBJECTS AND SUMMARY OF THE INVENTION

An object of the present invention is to provide a thin switch that replaces most of the complicated mechanical structure of conventional switches having a rotary motion function with an electrical structure and software processing.

A further object of the present invention is to provide a digital switch having a rotary motion detection function.

Still a further object of the present invention is to provide a digital switch having a rotary motion detection function that is inexpensive to manufacture.

Briefly stated, the present invention provides a membrane switch having a rotary motion detection function that comprises a flexible sheet, in which movable electrodes are formed that correspond to multiple keys, and a printed wiring board, in which fixed electrodes are formed that correspond to the movable electrodes. The flexible sheet and printed wiring board are arranged in layers so that the movable and fixed electrodes face each other with a prescribed spacing between them. When any key on the membrane switch is pressed and thus turned on, that key's signal is detected. When multiple keys are turned on in succession within a prescribed interval, codes are transmitted that correspond to the direction and speed of movement of the sequence of turned-on keys. The rotary motion keys are arranged in a circle. The codes that correspond to the direction and speed of shift of the turned-on keys are preset in a microprocessor. The rotary motion keys can be arranged on the same board with other general keys to make up a remote control device.

According to an embodiment of the invention, a membrane switch having a rotary motion detection function comprises: a flexible sheet; the flexible sheet including a plurality of movable electrodes aligned with multiple keys; a wiring board containing a plurality of fixed electrodes; each of the plurality of moveable electrodes aligned with and facing a one of the plurality of fixed electrodes; means for spacing the flexible sheet and the wiring board a fixed distance apart, whereby pressure on a one of the multiple keys closes a circuit between a selected one of the plurality of movable electrodes and the one of the fixed electrodes; closing of the one of the multiple keys being effective for transmitting a signal; and means, responsive to pressing more than one of the multiple keys in succession within a prescribed time interval, for transmitting a code that identifies a direction and a velocity of motion of the more than one of the multiple keys.

According to a feature of the invention, a method of controlling an electronic device by means of a limited number of keys comprises: arranging a plurality of keys in a circle on a membrane switch; interpreting activation, in sequence within a fixed time period, of at least three of the plurality of keys as a request for control; translating the request for control into a coded signal; and transmitting the coded signal to the electronic device.

According to another feature of the invention, a membrane switch for controlling an electronic device comprises: a flexible sheet; the flexible sheet including a first key and a plurality of additional keys arranged in a ring centered on the first key; the flexible sheet further including a plurality of movable electrodes; each of the movable electrodes being aligned with a one of the first key and the additional keys; a wiring board containing a plurality of fixed electrodes; each of the plurality of moveable electrodes aligned with and facing a one of the plurality of fixed electrodes; means for spacing the flexible sheet and the wiring board a fixed distance apart, whereby pressure on a one of the first key and the additional keys closes a circuit between a selected one of the plurality of movable electrodes and the one of the fixed electrodes; closing of the one of the first key and the additional keys being effective for transmitting a signal; and each of the first key and the additional keys being effective for transmitting a one of a plurality of related signals.

According to still another feature of the invention, a rotary motion switching device comprises: a wiring board; a plurality of fixed contacts disposed in a circle on the wiring board; a membrane; means for supporting the membrane a predetermined distance from, and generally parallel to, the circle; a plurality of movable contacts on the membrane facing the plurality of fixed contacts; means for rotating rotatable about an axis of the circle; and means, disposed on a surface of the means for rotating, for depressing the membrane locally to produce electrical contact between aligned pairs of the fixed and the movable contacts.

In a membrane switch having a rotary motion detection function comprised as described above, when a key on the surface of the flexible sheet is pressed, as with a finger, the movable electrode in the position of the key on the surface of the flexible sheet is pressed downward, thus making contact with the fixed electrode directly below, the key is turned on, and the key number of the pressed key is detected.

When a rotary motion operation is performed in which multiple keys are pressed in a certain direction at a certain speed, the direction and speed of shift of the rotary motion is recognized from the combination of the identification numbers of the multiple keys that have been turned on one after another, the sequence in which they have been turned on, and the number of keys turned on per unit time. The corresponding codes are then transmitted to the electronic device.

By arranging the rotary motion membrane switches on the same board with other membrane switches, it is possible to, for example, make the device smaller and still perform the operation of changing speed, such as to "fast forward" and "rewind", as well as selecting between play/record, pause, stop, turning the power on and off and moving from channel to channel.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 9:
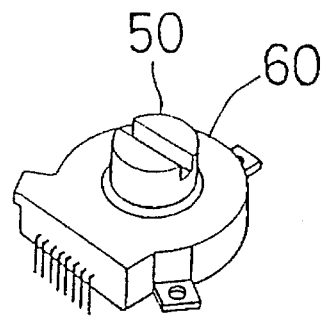
FIG. 9 is a perspective view of the switch of the prior art.

Referring to FIG. 9, a conventional switch having a rotary motion function has an inner shaft 50 and an outer shaft 60. Inner shaft 50 has a rotary motion function and outer shaft 60 has a shuttle function.

Figure 1:
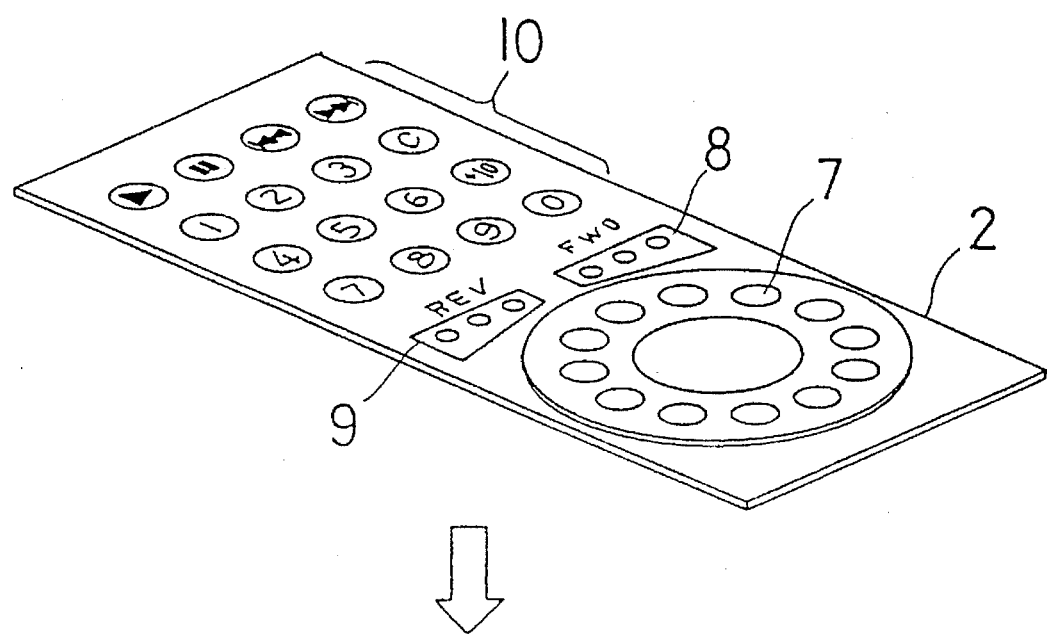
FIG. 1 is an exploded perspective view of the overall structure of the switch of the first embodiment of the present invention.
Figure 1:
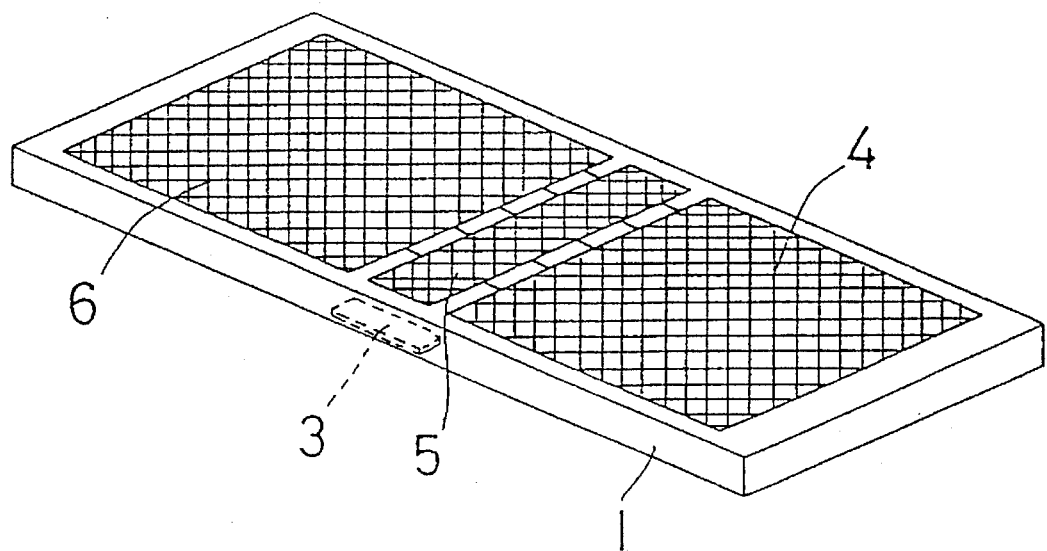

Referring to FIG. 1, a membrane switch having a rotary motion detection function according to the present invention may be used, for example, as a remote control device. It comprises a wiring board 1 laminated to a flexible sheet 2.

A microprocessor 3 is built into the back surface of wiring board 1. Wiring board 1 includes a plurality of wires—rotary key wires 4, shuttle key wires 5, and general key wires 6—printed on its front surface to form a matrix, as described below. Microprocessor 3 and wires 4, 5, and 6 are connected through holes in wiring board 1.

Flexible sheet 2 consists of a very thin sheet (for example, 280 microns) made from polycarbonate or polyester. A rotary motion key area 7, shuttle key areas 8 and 9, and a general key area 10 are disposed on the surface of flexible sheet 2.

Figure 2:
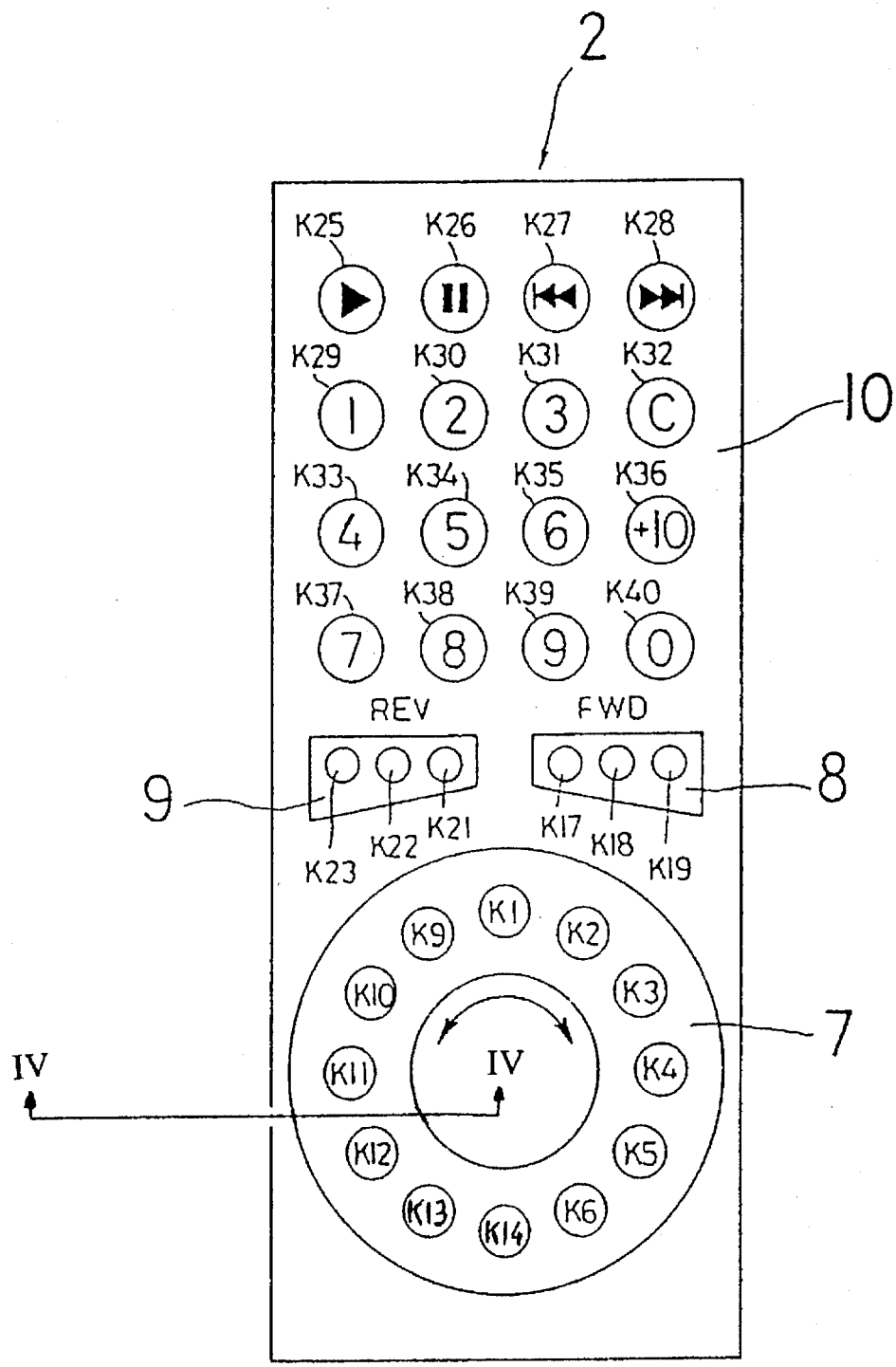
FIG. 2 is a top view of the flexible sheet of the switch of FIG. 1.

Referring to FIG. 2, a key number is assigned to each key or key positioned. That is, for the rotary motion key area 7, each key is positioned on a concentric circle. A total of 12 key numbers are assigned to these keys: keys K1–K6 clockwise, beginning with the uppermost key position K1, and keys K9–K14 counterclockwise from the uppermost key position K1.

A total of 6 shuttle keys are provided, 3 forward-direction (FWD) keys K17–K19 in shuttle key area 8, and 3 reverse-direction (REV) keys K21–K23 in shuttle key area 9. For the general keys, 16 keys K25–K40 are provided in general key area 10. Each of these general keys has a specific function, such as a play/record switch K25, a stop switch, a pause switch K26, a rewind switch K27, a fast forward switch K28 power switch, channel switches, and a switch for changing between a television and a tape recorder.

Figure 3:
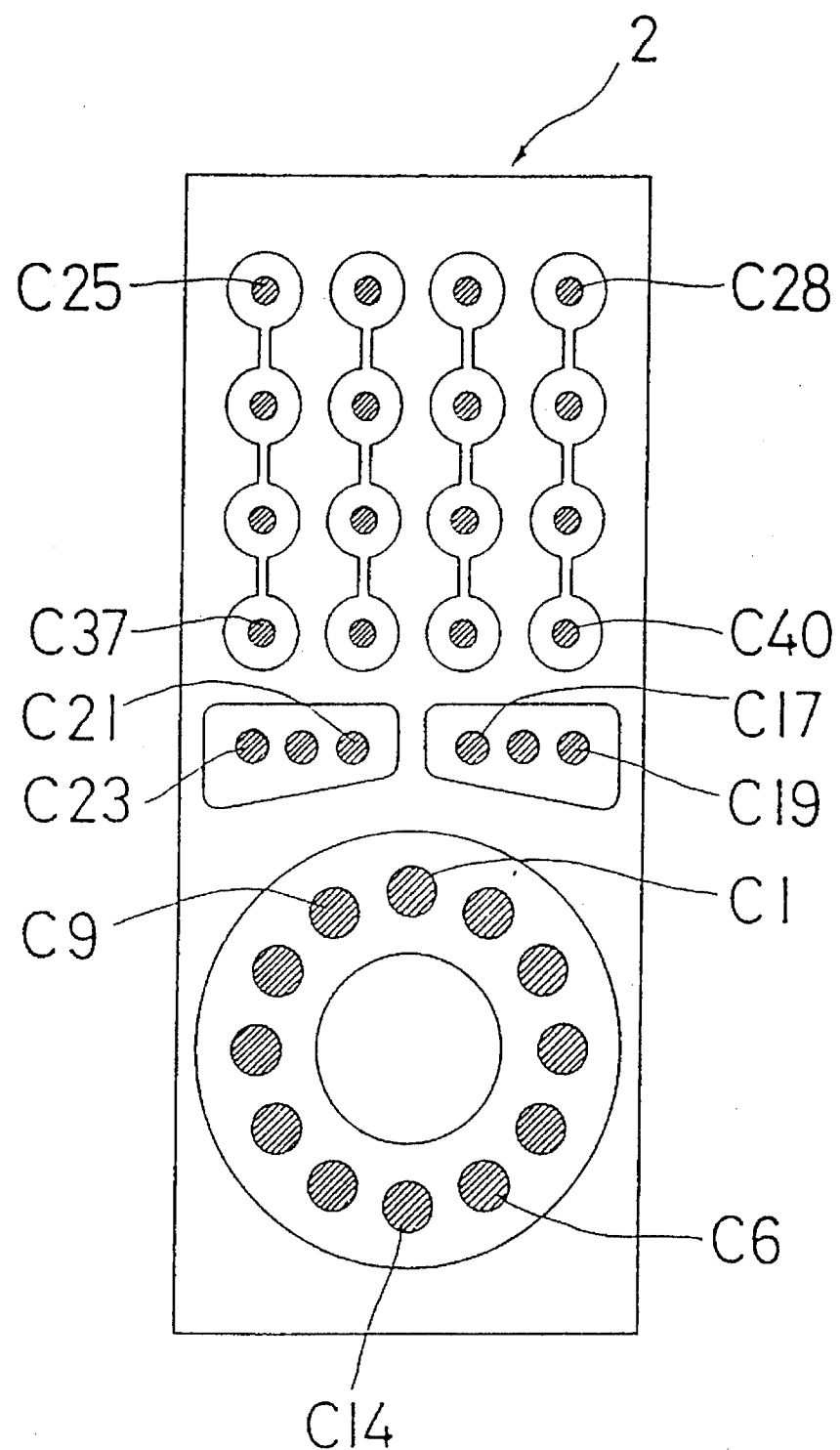
FIG. 3 is a bottom view of the flexible sheet of the switch of FIG. 1.

Referring to FIG. 3, movable carbon electrodes Ci (where i is the number that identifies the key) are printed on the back of flexible sheet 2 in all the key positions. A fixed carbon electrode (not shown) is printed on wiring board 1 opposite each carbon electrode Ci. The area around carbon electrodes Ci (where i=1–40) is raised slightly by embossing or other means so that, when wiring board 1 and flexible sheet 2 are laminated together, the movable electrodes are normally not in contact with the fixed electrodes.

Figure 4:
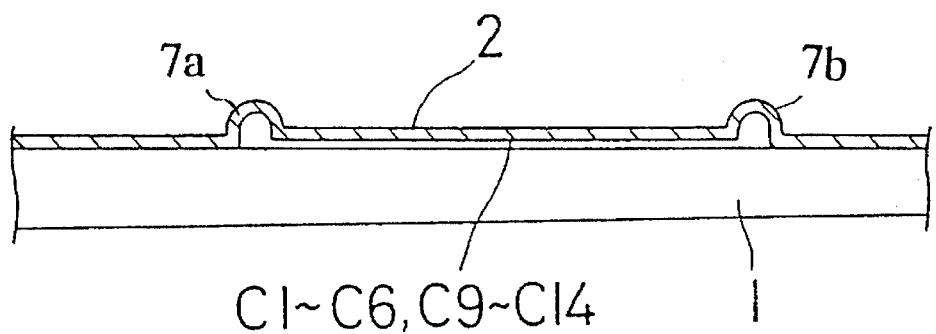
FIG. 4 is a cross-sectional view of FIG. 2 along IV—IV.

Referring to FIG. 4, rotary motion key area 7 is surrounded by an outer rib 7a about the outside of the circularly arranged keys K1–K6, K9–K14. An inner rib 7b surrounds the inside. The space between outer rib 7a and inner rib 7b is raised above the surface of wiring board 1. Movable carbon electrodes C1–C6, C9–C14 are affixed to the inside of the raised space. The space between outer rib 7a and inner rib 7b is set so that a person's finger fits comfortably therein and can move around the keys easily.

When a key Ki (i=1–40) on the surface of flexible sheet 2 is pressed by a person's finger, the pressed key forms a depression because flexible sheet 2 flexes. As a result the corresponding carbon electrode Ci comes into contact with a fixed electrode on wiring board 1. When the finger is lifted, flexible sheet 2 restores the carbon electrode Ci to its former position. In other words, the carbon electrode Ci performs the function of the short-circuiting electrode of a switch.

Figure 5:
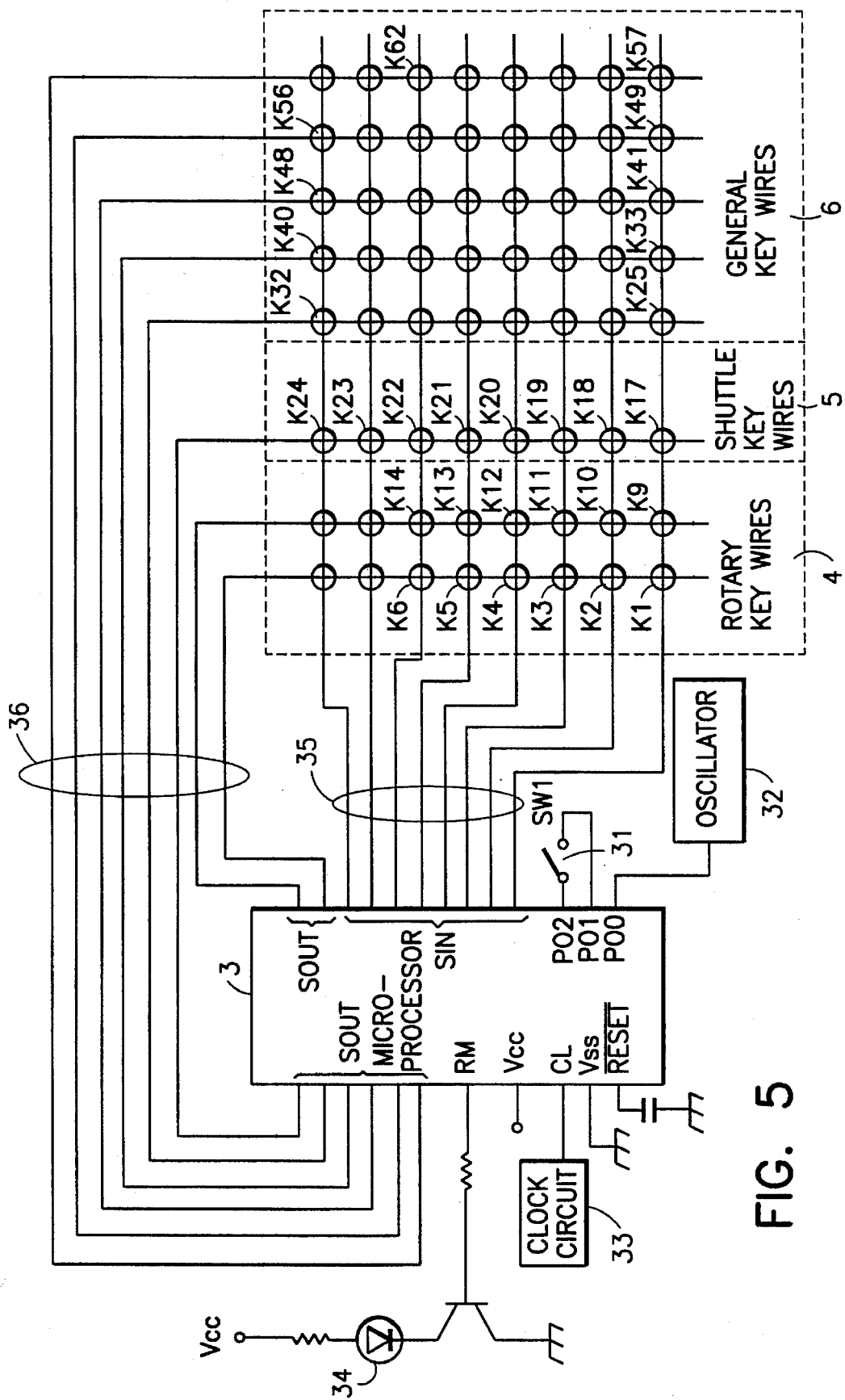
FIG. 5 is a circuit diagram for the printed wiring board of the switch of FIG. 1.

Referring to FIG. 5, the circuitry of wiring board 1 is arranged as follows. A wire group 35 and a wire group 36 are printed on wiring board 1 near each other as fixed electrodes in each key area. Each intersection of wire groups 35 and 36 corresponds to a key position K1–K62. That is, in terms of circuitry, the key positions K1–K62 form a matrix.

Wire group 35 is connected to multiple scan-in ports SIN of microprocessor 3. Wire group 36 is connected to multiple scan-out ports SOUT of microprocessor 3.

Figure 6:
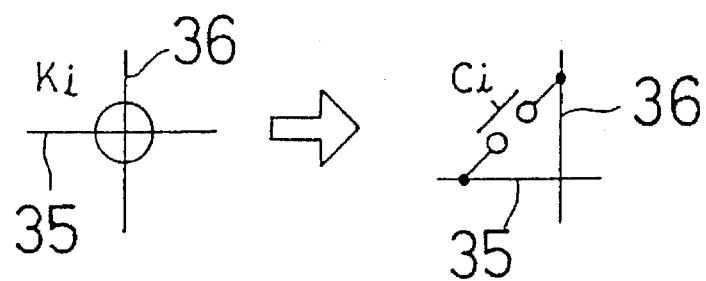
FIG. 6 is a diagram that shows what happens in the circuit of FIG. 5 when a key is pressed on the switch of FIG. 1.

Referring to FIG. 6, the two printed wires that intersect at each key position Ki are connected ("key on") or separated ("key off") by carbon electrode Ci, thus forming an on/off switch. During a fixed period, microprocessor 3 sequentially outputs signals at a low level L from ports SOUT and sequentially checks ports SIN for the presence of input signals at low level L.

Referring again to FIG. 5, when all keys are off, all ports SIN are at a high level H, and microprocessor 3 is in standby. If a key is closed, the corresponding port SIN goes to a low level L. Microprocessor 3 detects the position of the key that has closed, shifts into a wakeup state, and executes a prescribed program.

Microprocessor 3 has, in addition to what has been described above, a power source terminal Vcc, a ground terminal Vss, and a reset terminal $\overline{\text{RESET}}$. In addition, a mode switch 31, an oscillator 32, a clock circuit 33, and a remote control output circuit 34 are attached to microprocessor 3. When mode switch 31 is closed, microprocessor 3 goes into shuttle mode. When mode switch 31 is open, microprocessor 3 goes into rotary motion detection/shuttle mode. Clock circuit 33 selects a clock pulse (at, for example, 960 kHz) from oscillator 32 that sets the timing for the cycles of microprocessor 3. Remote control output circuit 34 emits remote control signals, such as infrared signals, that are controlled by the output codes of microprocessor 3 if the membrane switch of this invention is used as a remote control device.

The rotary motion detection function determines the direction and speed of shift of the fingers that press the keys on the surface of flexible sheet 2, based on the sequence in which rotary motion keys K1–K6 and K9–K14 come on and the number that come on within a unit time interval.

There is no specific trigger key that initiates the rotary motion detection function. When any of keys K1–K62 is turned on, microprocessor 3 shifts from standby to wakeup. Output from the rotary motion detection function begins after the direction of rotation has been established. The rotary motion detection operation is deemed begun when three keys, including the first very pressed, are pressed in succession. At the same time the direction of rotation is recognized. And, when the first key pressed is switched to the on state, detection begins of the number of keys that are switched on per unit time, as described below.

Thereafter, while only the direction is recognized, a code is transmitted that corresponds to the count of the number of keys turned on within the prescribed time (for example, in this embodiment, 90 ms is the time in which remote control signals are sent, the same as the time for transmission of a single frame).

That is, microprocessor 3 determines the code to be transmitted by counting the number of rotary motion keys K1–K6, K9–K14 that are turned on one after another during a prescribed time interval, as in the following table. The key scanning period here is set to 10 ms.

TABLE 1

| Rotary Dialing Operation | | |
|---|---|---|
| | Number of Keys Turned on During Prescribed Interval | Output |
| CLOCKWISE | | |
| Low Speed | 1 | 20 |
| . | 2–3 | 21 |
| . | 4–5 | 22 |
| High Speed | 6 or more | 23 |
| COUNTERCLOCKWISE | | |
| Low Speed | 1 | 24 |
| . | 2–3 | 25 |
| . | 4–5 | 26 |
| High Speed | 6 or more | 27 |

The following example explains the operation of the rotary motion detection function. If key K2 is pressed first, as soon as that happens, microprocessor 3 goes into the wakeup state, and scan signals are generated at 10 ms intervals from terminals SOUT. If key K3 is then pressed, no control code is transmitted. If, following that, key K4 is pressed, microprocessor 3 recognizes a rotary motion detection operation.

If, within the prescribed time of 90 ms from the initial pressing of key K2, keys K3, K4, and K5 are also pressed, code 22 will be transmitted, as shown in Table 1 above. If thereafter keys K6, K14, and K13 are also pressed within the same 90 ms, code 23 will be transmitted.

Processing of key presses is controlled so that microprocessor 3 ignores two successive presses on the same key, as, for example, because of chattering. Microprocessor 3 also ignores the signal if adjacent keys are doubly pressed and if adjacent keys are alternately pressed.

If, while one key remains pressed, motion is reversed without lifting the finger, the key that moved in the reverse direction is not immediately counted. This is because it is deemed to be the same key, as when adjacent keys are pressed alternately, as explained above. Only when a new key is pressed in the reverse direction is it recognized, and the code for the lowest speed in that reverse direction is then transmitted.

For example, if the keys are pressed in the sequence K2→K3→K2→K1, the sequence of K2→K3→K2 is recognized as only one key. If key K1 is pressed immediately thereafter, microprocessor 3 recognizes that a operation has been made in the reverse direction (counterclockwise).

The rotary motion keys are normally turned on in succession, but it is conceivable that keys could be turned on discontinuously through rapid motion. In such an event, microprocessor 3 deems the skipping over of one key to be the same as a continuous pressing of successive keys, and the count of keys pressed is incremented by 1.

In rotary motion detection mode, the output of the code shown above in Table 1, together with a code indicating the direction of the rotary motion detection operation, is modulated on an infrared signal and transmitted by the same means and with the same timing as when another general key is pressed. When all the rotary motion keys are switched off, then, after a fixed time, the rotary motion detection mode is canceled, and the transmission of output codes terminates.

The shuttle function in rotary motion detection/shuttle mode is carried out by successively pressing keys in the forward-direction shuttle key area K17–K20 or in the reverse-direction shuttle key area K21–K24. In each of these key areas, double pressing is allowed. If two keys are pressed successively, the code corresponding to the higher-numbered key (for K17 and K18, that key is K18) is transmitted. When the shuttle keys have been off for the prescribed time (100 ms), the "key off" state is recognized. At this time the shuttle function is canceled and the transmission of codes is terminated. Regarding the timing and format of code transmissions from general keys, transmission is carried out while a key is on and blocked when the keys are off.

The foregoing describes the rotary motion detection/shuttle function for an embodiment that uses specialized rotary motion keys and shuttle keys, but specialized keys need not be provided. In another embodiment, a general-use key area can also perform rotary motion detecting/shuttle operations. For example, referring to FIG. 2, it would suffice to write a program for microprocessor 3 so that rotary motion detection/shuttle operations could be carried out with eight keys that remain after eliminating some of the keys (for example, the four corner keys) and the four central keys in the general key area.

In the above embodiment, the speed of the rotary motion operation was turned into a specific output code. One could also transmit a specific code that depends on the acceleration (rather than the speed) of the rotary motion operation. Also, in the membrane switch of the above embodiment, the spacing between the fixed and movable electrodes is maintained by embossing flexible sheet 2, but one could insert a separate spacer between them instead.

Figure 7:
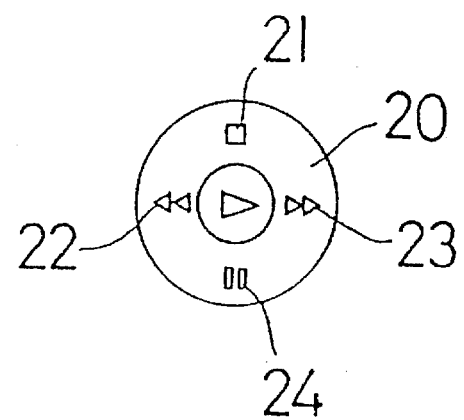
FIG. 7 is a diagram of a second embodiment of the present invention.

Referring to FIG. 7, in a second embodiment of the present invention, multiple keys 21–24 are distributed in a ring-shaped area 20 around a center key and given composite functions that correspond to successive key-on operations and individual key-on operation: The composite functions that correspond to successive key-on operations include conventional functions such as REWIND 22 and FAST FORWARD 23 indicated by standard symbols. The composite functions that correspond to individual key-on operation include PLAY/RECORD (shown in the center), STOP 21, and PAUSE 24.

A middle key, shown here marked with a PLAY symbol, is surrounded by additional keys 21–24 that form a ring around the middle key. Similar to the previous embodiment, the flexible sheet contains movable electrodes a aligned with the keys and facing a printed wiring board containing fixed electrodes that are aligned with the movable electrodes. The microprocessor is programmed to detect individual key-on operation, in which case the function associated with each individual key is activated. The microprocessor is also programmed to detect successive key-on operations, in which case the function depends on the direction and speed of the successive key-on operations as described in the first embodiment.

Figure 8:
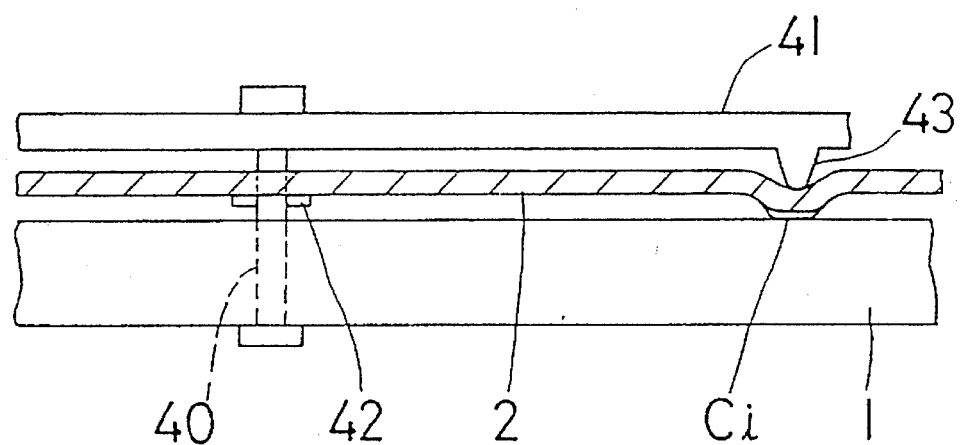
FIG. 8 is a diagram of a third embodiment of the present invention.

Referring to FIG. 8, in a third embodiment of the present invention, rotary motion detection operations are made automatically. Specifically, a shaft 40 that vertically pierces wiring board 1 and flexible sheet 2 is provided in the central position of the ring of the rotary motion area. Affixed to the upper end of shaft 40 is the center of a disk 41 that can rotate freely. In this embodiment, flexible sheet 2 is supported by a horizontal plate 42 affixed to shaft 40.

At one spot on the outer rim of disk 41 is a downward-pointing spherical protrusion 43. With such a structure, when disk 41 makes a rotary motion action, the key positions of flexible sheet 2 are pressed by protrusion 43. This pressure bends them successively downward, thereby causing carbon electrodes Ci to come into contact successively with printed board 1, turning keys on in succession.

In the foregoing we have described an embodiment in which the membrane digital switch of the present invention is applied to a remote control device. However, the idea of the present invention is to recognize the quantity and speed of a rotary motion operation and to transmit codes that correspond to combinations of recognized parameters, by providing a microprocessor and printed wirings on a wiring board, laminating onto the surface of this wiring board a flexible membrane on which are arranged carbon electrodes Ci in the key positions, and using the microprocessor to detect rotary motion operations on the surface of the membrane.

Thus the present invention can be applied widely in the field of mechanical devices, not only to remote control devices, to transmit codes according to the direction and speed of key operations on the surface of a membrane.

As explained above, the membrane switch having a rotary motion detection function according to the present invention is a very thin and compact membrane switch with a simple structure in which fixed electrodes attached to a microprocessor and a printed wiring board are laminated together with a flexible sheet to which movable electrodes are affixed in key positions. Thus the switches of the present invention are thinner and less expensive to make than the switches currently available.

In addition, the switch of the present invention can be combined with, for example, specific switches for changing channels in a remote control device. Along with making it possible to use scanning to change the speed, as between fast forward and rewind, with a single remote control device, the device of the present invention can be made smaller than remote-control devices presently in use.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A membrane switch having a rotary motion detection function that comprises:

a flexible sheet;

said flexible sheet including a plurality of movable electrodes aligned with a plurality of multiple keys;

a wiring board containing a plurality of fixed electrodes;

each of said plurality of moveable electrodes aligned with and facing a one of said plurality of fixed electrodes;

means for spacing said flexible sheet and said wiring board a fixed distance apart, whereby pressure on a one of said multiple keys closes a circuit between a selected one of said plurality of movable electrodes and said one of said fixed electrodes thereby transmitting a signal;

a first group of said plurality of multiple keys;

a second group of said plurality of multiple keys;

means, responsive to pressing at least two of said second group of multiple keys in succession within a prescribed time interval, for transmitting a code that identifies a rotary direction and a velocity of motion of the successive pressing of said at least two of said second group of multiple keys.

2. A membrane switch having a rotary motion detection function as in claim 1, wherein said second group of multiple keys are arranged in a circle.

3. A membrane switch having a rotary motion detection function as in claim 1, wherein:

said membrane switch includes a microprocessor; and said code is preset in said microprocessor.

4. A membrane switch having a rotary motion detection function as in claim 1, wherein said first group of multiple keys are remote control switches adjacent to said second group of multiple keys.

5. A membrane switch having a rotary motion detection function as in claim 4, wherein said second group of multiple keys are arranged in a circle.

6. A method of controlling an electronic device by means of a limited number of keys, which comprises:

arranging a plurality of keys in a rotary dial design on a membrane switch;

determining an activation, in sequence within a fixed time period, of at least three of said plurality of keys as a request of control for said electronic device;

translating said request for control into a coded signal for transmission; and transmitting said coded signal to said electronic device.

7. A method of controlling an electronic device as in claim 6, wherein said fixed time period in the step of interpreting is 90 ms.

8. A membrane switch for controlling an electronic device, comprising:

a flexible sheet;

said flexible sheet including a plurality of keys arranged in a ring;

said flexible sheet further including a plurality of movable electrodes;

each of said movable electrodes being aligned with a corresponding key;

a wiring board containing a plurality of fixed electrodes;

each of said plurality of movable electrodes aligned with and facing a corresponding fixed electrode;

means for spacing said flexible sheet and said wiring board a fixed distance apart, whereby pressure on one of said keys closes a circuit between a selected one of said plurality of movable electrodes and its corresponding fixed electrode;

means, responsive to pressing at least two of said keys in succession within a prescribed time interval, for transmitting a code that identifies a rotary direction and a velocity of motion of the successive pressing of said keys; and means responsive to said code for transmitting a signal to said electronic device.

9. A membrane switch as in claim 8, further comprising:

a center key centered within said ring of keys;

said center key is effective for sending a PLAY/RECORD signal;

a first of said plurality of keys is effective for sending a FAST FORWARD signal;

a second of said plurality of keys is effective for sending a REWIND signal;

a third of said plurality of keys is effective for sending a STOP signal; and a fourth of said plurality of keys is effective for sending a PAUSE signal.

10. A rotary motion detection device, comprising:

a wiring board;

a plurality of fixed contacts disposed in a circle on said wiring board;

a membrane;

means for supporting said membrane a predetermined distance from, and generally parallel to, said wiring board;

a plurality of movable contacts on said membrane facing said plurality of fixed contacts;

means for rotating being rotatable about an axis of said circle; and means disposed on a surface of said means for rotating, for depressing said membrane locally to produce electrical contact between aligned pairs of said fixed and said movable contacts.

* * * * *